(12) United States Patent  
Lee (10) Patent No.: US 8,307,543 B2  
(45) Date of Patent: Nov. 13, 2012

(54) SEMICONDUCTOR CHIP ATTACHING APPARATUS

(75) Inventor: Su-Young Lee, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 401 days.

(21) Appl. No.: 12/772,561

(22) Filed: May 3, 2010

(65) Prior Publication Data

US 2011/0035936 A1    Feb. 17, 2011

(30) Foreign Application Priority Data

Aug. 11, 2009 (KR) .................. 10-2009-0073922

(51) Int. Cl.  
*B23P 19/00* (2006.01)

(52) U.S. Cl. .............. 29/740; 29/741; 29/743; 294/188; 414/737; 414/763; 414/941

(58) Field of Classification Search .................. 29/740, 29/741, 743, 830, 832; 294/188; 414/737, 414/763, 816, 936, 941; 438/455  
See application file for complete search history.

(56) References Cited

U.S. PATENT DOCUMENTS

| 4,752,180 | A | * | 6/1988 | Yoshikawa | .................. 414/737 |
| 5,129,827 | A | * | 7/1992 | Hoshi et al. | .................. 438/457 |
| 7,650,688 | B2 | * | 1/2010 | Lee et al. | .................. 29/743 |
| 2003/0115747 | A1 | | 6/2003 | Schnetzler et al. | |

FOREIGN PATENT DOCUMENTS

| JP | 2008-159724 | 7/2008 |
| KR | 2003-0052986 | 6/2003 |
| KR | 10-2007-0016739 | 2/2007 |

* cited by examiner

*Primary Examiner* — Thiem Phan  
(74) *Attorney, Agent, or Firm* — Onello & Mello, LLP (57) ABSTRACT

Provided are a semiconductor chip attaching apparatus and a semiconductor chip attaching method. The semiconductor chip attaching apparatus includes a collet body comprising a pick-up pad and a pad support and a collet plate on the collet body, the collet plate having a central portion. A lower surface of the edge portion contacts an upper surface of the pad support. An edge portion of the lower surface is spaced apart from the upper surface of the pad support. The apparatus further includes a first pipe extending through the collet plate and the collet body. The collet plate includes a second pipe in the edge portion.

12 Claims, 7 Drawing Sheets

SEMICONDUCTOR CHIP ATTACHING APPARATUS

CROSS-REFERENCE TO RELATED APPLICATIONS

This U.S. non-provisional patent application claims priority under 35 U.S.C. §119 to Korean Patent Application No. 10-2009-0073922, filed on Aug. 11, 2009, the entire contents of which are hereby incorporated by reference in their entirety.

BACKGROUND

The present inventive concepts relate to semiconductor assembly apparatus and methods, and more particularly, to a semiconductor chip attaching apparatus and a semiconductor chip attaching method.

A semiconductor assembly process includes separating semiconductor chips manufactured using a wafer process, electrically connecting the separated semiconductor chips to each other to utilize the semiconductor chips as actual electric components, and sealing and packaging the semiconductor chips to protect the semiconductor chips from damage, for example, caused by an external impact. Generally, one wafer has tens or hundreds of semiconductor chips on which the same circuit pattern can be printed. The semiconductor chips formed on the wafer are separated from each other.

The semiconductor assembly process includes a die attaching process. The die attaching process includes a process in which the semiconductor chips are separated from a wafer and are mounted on a lead frame or a printed circuit board (PCB). The separated semiconductor chips are picked up and moved by a pick-up apparatus, and then attached to the lead frame or the PCB. Thereafter, interconnections connecting the semiconductor chips to the lead frame are formed.

With the trend towards high performance of electric devices, it is desirable an operation speed of a semiconductor chip becomes increasingly faster. Also, as electronic devices are miniaturized, a semiconductor package likewise becomes miniaturized, as well as slim and lightweight. In order to achieve this, the thickness of semiconductor chips can be reduced by performing a back grinding process in which a back surface of a wafer opposite a surface on which an integrated circuit is ground until a desired thickness is achieved. Accordingly, it is imperative that a semiconductor chip attaching apparatus accommodate such miniaturization.

SUMMARY

The present disclosure provides a semiconductor chip attaching apparatus and a semiconductor chip attaching method, which can improve an adhesive strength between a semiconductor chip and a substrate.

The object of the present invention is not limited to the aforesaid, but other objects not described herein will be clearly understood by those skilled in the art from descriptions below.

In accordance with aspects of the present inventive concepts, an semiconductor chip attaching apparatus includes: a collet body including a pick-up pad and a pad support; a collet plate on the collet body, the collet plate having a central portion, wherein a lower surface of the central portion contacts an upper surface of the pad support, the collet plate further having an edge portion, wherein a lower surface of the edge portion is spaced apart from the upper surface of the pad support; and a first pipe extending through the collet plate and the collet body, wherein the collet plate comprises a second pipe in the edge portion.

In some embodiments, a lower surface of the collet plate may have a curvature in a direction opposite to that of the collet body.

In other embodiments, the upper surface of the pad support is flat. In other embodiments, the upper surface of the pad support may have a curvature in a direction opposite to that of the collet plate.

In still other embodiments, the pick-up pad may include a third pipe to which a semiconductor chip is attached.

In other embodiments, the second pipe and the third pipe are connected to the first pipe. In other embodiments, a lower surface of the pick-up pad further comprises a first pick-up trench connected to the third pipe.

In other embodiments, the third pipe has a diameter less than that of the second pipe. In other embodiments, the second pipe has a diameter less than that of the first pipe.

In other embodiments, the collet body may be formed of a material having elasticity.

In accordance with other aspects of the inventive concept, a method of attaching the semiconductor chip using a semiconductor chip attaching apparatus, the apparatus comprising a collet body having a pick-up pad and a pad support and a collet plate on the collet body, wherein a central portion of a lower surface of the central portion contacts an upper surface of the pad support and an edge portion of the lower surface is spaced apart from the upper surface of the pad support, comprises: applying a first vacuum to the collet body such that the collet body has a curvature in a direction of the collet plate; applying a second vacuum to attach the semiconductor chip to the pick-up pad; attaching the semiconductor chip attached to the pick-up pad to a substrate; and detaching the semiconductor chip from the pick-up pad by deforming the collet body such that the collet body has a curvature in a direction opposite to that of the collet plate.

In some embodiments, the methods may further include compressing the edge portion of the semiconductor chip using the deformed collet body having the curvature in the direction opposite to that of the collet plate.

In other embodiments, the first vacuum is applied to the collet body having a flat upper surface, which extends along a longitudinal axis.

In other embodiments, deforming the collet body further includes applying compressed air to the upper surface of the collet body.

In still other embodiments, the first vacuum is applied to the upper surface of the collet body having the curvature in the direction opposite to that of the collet plate.

In other embodiments, deforming the collet body further comprises removing the first vacuum from the upper surface of the collet body.

In other embodiments, applying of the first vacuum and applying the second vacuum are performed at the same time.

In other embodiments, an adhesion layer is provided on the substrate.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Various example embodiments will now be described more fully with reference to the accompanying drawings in which some example embodiments are shown. These inventive concepts may, however, be embodied in different forms and should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present inventive concept.

Hereinafter, a chip pick-up apparatus and a chip attaching method will be described in detail with reference to the accompanying drawings.

Figure 1:
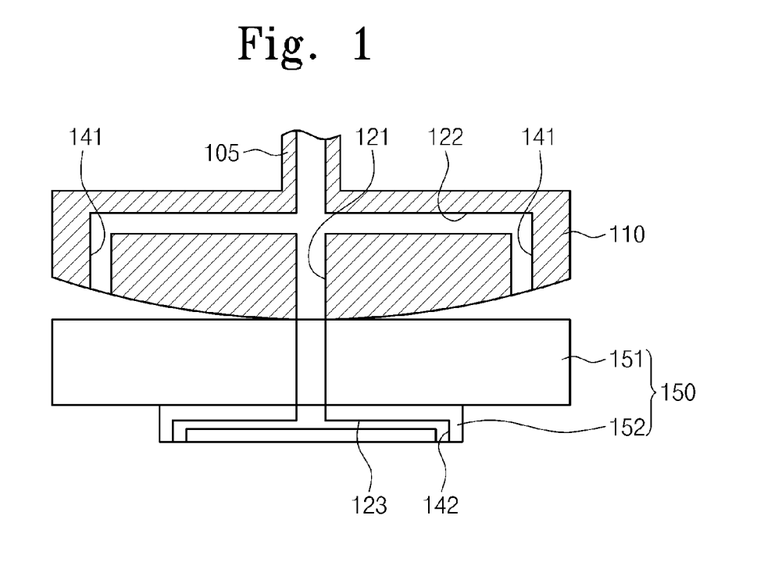
FIGS. 1 through 3 are sectional and plan views illustrating a semiconductor chip attaching apparatus according to an embodiment of the inventive concept.
Figure 2:
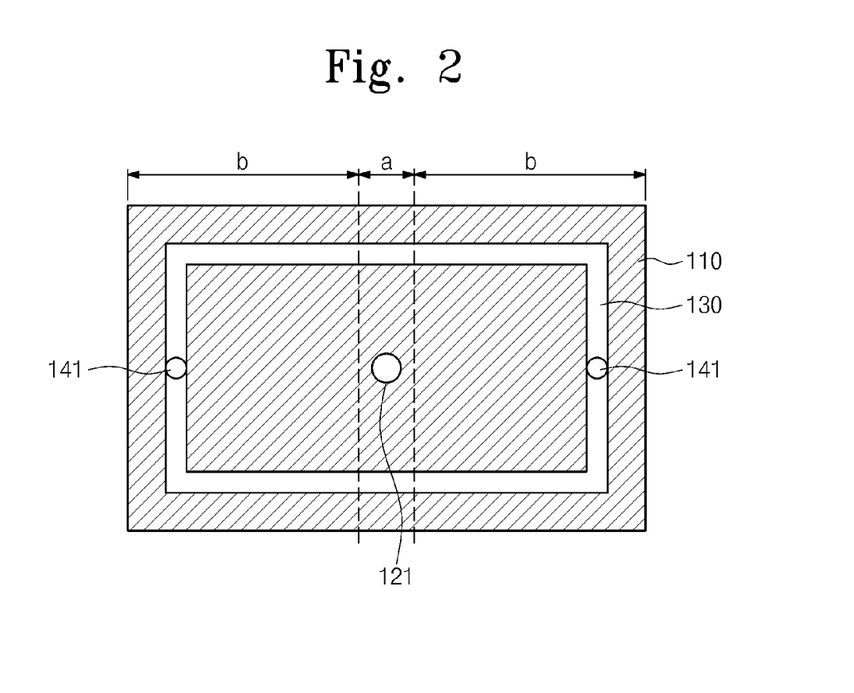
Figure 3:
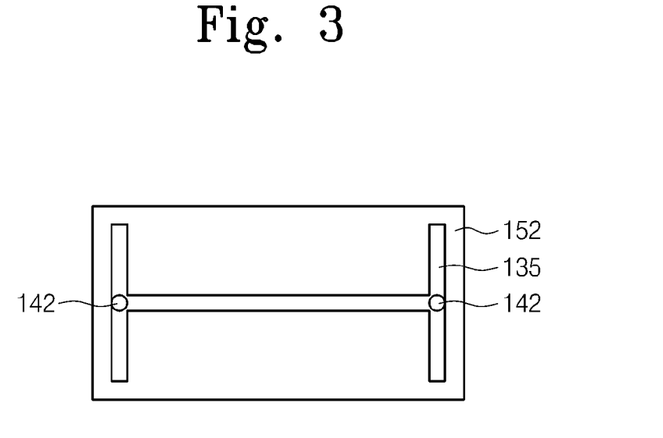

FIGS. 1 through 7 are views for explaining a semiconductor chip attaching apparatus and a semiconductor chip attaching method according to an embodiment of the inventive concept. In particular, FIGS. 1 through 3 are sectional and plan views illustrating a semiconductor chip attaching apparatus according to an embodiment of the inventive concept, and FIGS. 4 through 7 are sectional and plan views illustrating a semiconductor chip attaching method according to an embodiment of the inventive concept.

Referring to FIGS. 1 to 3, a collet plate 110 may be disposed on a collet body 150. In an embodiment, the collet plate 110 is formed of carbon steel. The collet plate 110 may be connected to a shaft 105. A first pipe 121 extends from the shaft 105 to pass through the collet plate 110 and the collet body 150. The first pipe 121 may be configured to apply a vacuum to a semiconductor chip attaching apparatus.

FIG. 2 is a plan view illustrating a lower surface of the collet plate 110. The collet plate 110 may include a central portion a and at least one edge portion b. The central portion a may be a portion at which the collet plate 110 is attached to the collet body 150. The central portion a may be attached to an upper surface of the collet body 150 using an adhesive. The edge portion b may be spaced from the collet body 150. As shown in the sectional view of FIG. 1, the collet plate 110 may have a curvature in a direction opposite to that of the collet body 150, and thus, the edge portion b may be spaced from the collet body 150.

The collet plate 110 may include a second pipe 122 to deform the collet body 150 so as to have a curvature in a direction of the collet plate 110. A vacuum may be applied to the second pipe 122 to deform the collet body 150 such that the collet body 150 has the curvature in the direction of the collet plate 110. The second pipe 122 may be provided in the collet plate 110. The second pipe 122 may have a diameter less than that of the first pipe 121. The second pipe 122 may extend to a lower surface of the collet plate 110 through a pick-up hole 141. The second pipe 122 may be connected to the first pipe 121, such that when a vacuum is applied to the first pipe 121, the vacuum may also be applied to the second pipe 122 and the first pick-up hole 141.

A first pick-up trench 130 connected to the first pick-up hole 141 may be provided in the lower surface of the collet plate 110. The vacuum or compressed air applied to the second pipe 122 may be supplied to the entire lower surface of the collet plate 110 through the first pick-up trench 130. A configuration of the first pick-up trench 130 is not limited to that of FIG. 2. For example, the first pick-up trench 130 may have a round shape, an oval shape, a straight line shape, or other shape known to those of ordinary skill in the art.

FIG. 3 is a plan view illustrating a lower portion of the collet body 150. As shown in FIGS. 2 and 3, the collet body 150 may include a pick-up pad 152 and a pad support 151. The pick-up pad 152 may pick up a semiconductor chip by applying a vacuum. The pick-up pad 152 may have a size less than that of the semiconductor chip to easily attach the semiconductor chip. The pick-up pad 152 may include a third pipe 123 to attach the semiconductor chip. A vacuum may be applied to the third pipe 123 to pick up the semiconductor chip. The third pipe 123 may be connected to the first pipe 121. The third pipe 123 may be different in diameter from the diameters of the first and second pipes 121 and 122 to provide a pressure required for picking up the semiconductor chip. In an embodiment, the third pipe 123 may have a diameter less than those of the first and second pipes 121 and 122. The third pipe 123 may extend to a lower portion of the pick-up pad 152 through a second pick-up hole 142. A second pick-up trench 135 connected to the second pick-up hole 142 may be provided in a lower surface of the pick-up pad 152. The vacuum or compressed air applied to the third pipe 123 may be supplied to the entire lower surface of the pick-up pad 152 through the second pick-up trench 135. A configuration of the second pick-up trench 135 is not limited to that of FIG. 3. For example, the second pick-up trench 135 may have a round shape, an oval shape, a straight line shape, or other shape known to those of ordinary skill in the art.

The pad support 151 may be disposed between the collet plate 110 and the pick-up pad 152. The pick-up pad 152 and/or the pad support 151 may be formed of materials having elasticity or related properties. For example, the pick-up pad 152 and the pad support 151 may be formed of rubber. The pad support 151 may be deformed by the second pipe 122 to have a curvature. The pad support 151 may support the pick-up pad 152 and transfers the deformation due to the second pipe 122 to the pick-up pad 152. Thus, the pick-up pad 152 may be deformed to have the curvature. The pad support 151 may have a flat upper surface, which extends along a longitudinal axis, and be in a state where the vacuum or compressed air is not applied. Thus, an edge portion of the pad support 151 may be spaced apart from the collet plate 110 in the state where the vacuum or compressed air is not applied.

The collet body 150 may be deformed to have the curvature, thereby additionally compressing an edge portion of the semiconductor chip. In recent years, there is a tendency of significantly thinning the semiconductor chip. As the semiconductor chip decreases in thickness, the semiconductor chip may be bent due to a difference of thermal expansion coefficient between a metal interconnection and a silicon substrate. Specifically, the edge portion of the semiconductor chip may become loose. The bent semiconductor chip may cause various limitations during the semiconductor chip assembly process. When the bent semiconductor chip is attached to a printed circuit board (PCB) or a lead frame, it may be difficult to apply a uniform pressure to the semiconductor chip. Specifically, when the semiconductor chip is attached to the substrate using an adhesive film, a space may be defined between the semiconductor chip and the substrate. In this state, when the adhesive film is cured several times before a molding process is performed, an interface between the semiconductor chip and the adhesive film may be separated. Thus, reliability of the product may decrease. According to an embodiment of the inventive concept, the edge portion of the semiconductor chip may be additionally compressed by the collet body 150 to prevent a space from being formed between the semiconductor chip and the substrate.

FIGS. 4 through 7 are sectional and plan views illustrating a semiconductor chip attaching method according to an embodiment of the inventive concept.

Figure 4:
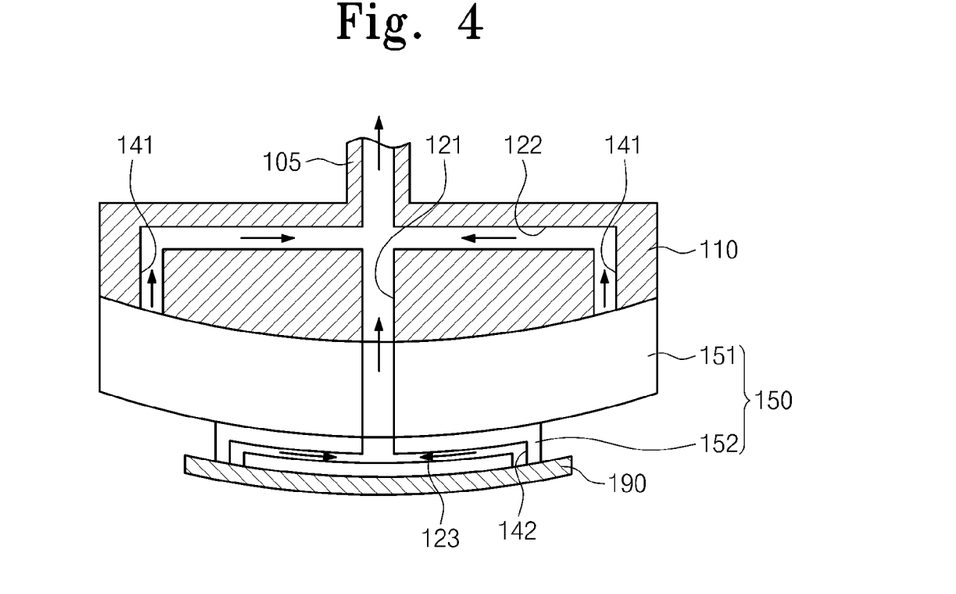
FIGS. 4 through 7 are sectional and plan views illustrating a semiconductor chip attaching method according to an embodiment of the inventive concept.

Referring to FIG. 4, a semiconductor chip 190 is attached to the pick-up pad 152. A vacuum may be applied to attach the semiconductor chip 190 to the pick-up pad 152. The vacuum may be provided through a first pipe 121, a third pipe 123, a second pick-up hole 142, and a second pick-up trench, for example, second pick-up trench 135 shown in FIG. 3 to attach the semiconductor chip 190 to the pick-up pad 152.

A vacuum may be applied in this manner allow the collet body 150 having the flat upper surface to have a curvature in a direction of the collet plate 110. To achieve this, the vacuum may be provided to the space between the pad support 151 and the collet plate 110 through the first pipe 121, the second pipe 122, the first pick-up hole 141, and the first pick-up trench 130. The pad support 151 is deformed by the vacuum to have a curvature in the direction of the collet plate 110. In an embodiment, the top surface of the pad support 151 abuts the surface of the collet plate 110, resulting in a curvature of the pad support 151 that is similar to the curvature of the collet plate 110.

The edge of the pad support 151 may contact the collet plate 110 due to the vacuum. Also, the pick-up pad 152 may be deformed by the deformation of the pad support 151 to have a curvature in the direction of the collet plate 110. Thus, the pick-up pad 152 may easily pick up the semiconductor chip 190 by having a curvature in the direction of the collet plate 110, in particular, in cases where the semiconductor chip 190 has a curvature after being temporarily attached to the pick-up pad by the vacuum.

Figure 5:
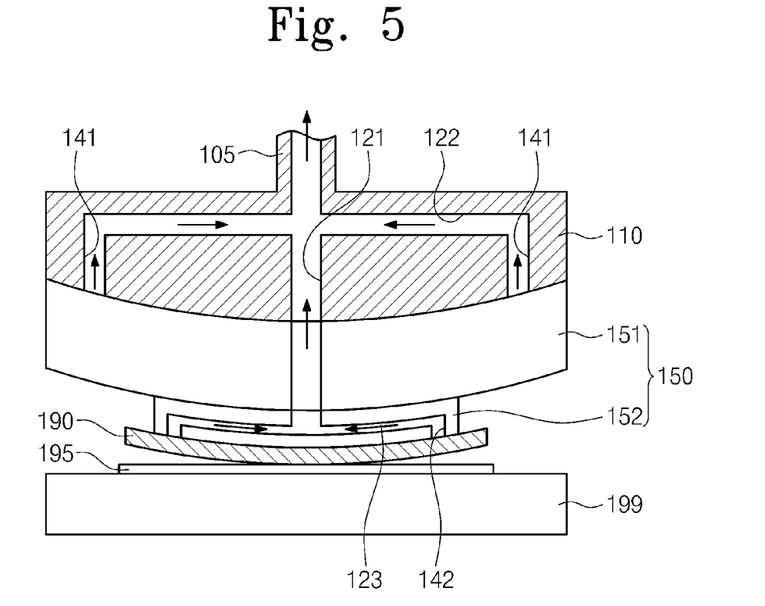

Referring to FIG. 5, the semiconductor chip 190 may be disposed on a substrate 199 in cases where the semiconductor chip 190 is picked up by the pick-up pad 152. An adhesion layer 195 may be disposed between the substrate 199 and the semiconductor chip 190. The semiconductor chip 190 may adhere to the substrate 199 by the adhesion layer 195. The adhesion layer 195 may be an adhesive or an adhesion film. The substrate 199 may include a PCB or a lead frame. When the semiconductor chip 190 has the curvature in the direction of the collet body 150, the edge portion of the semiconductor chip 190 may be spaced apart from the adhesion layer 195.

Figure 6:
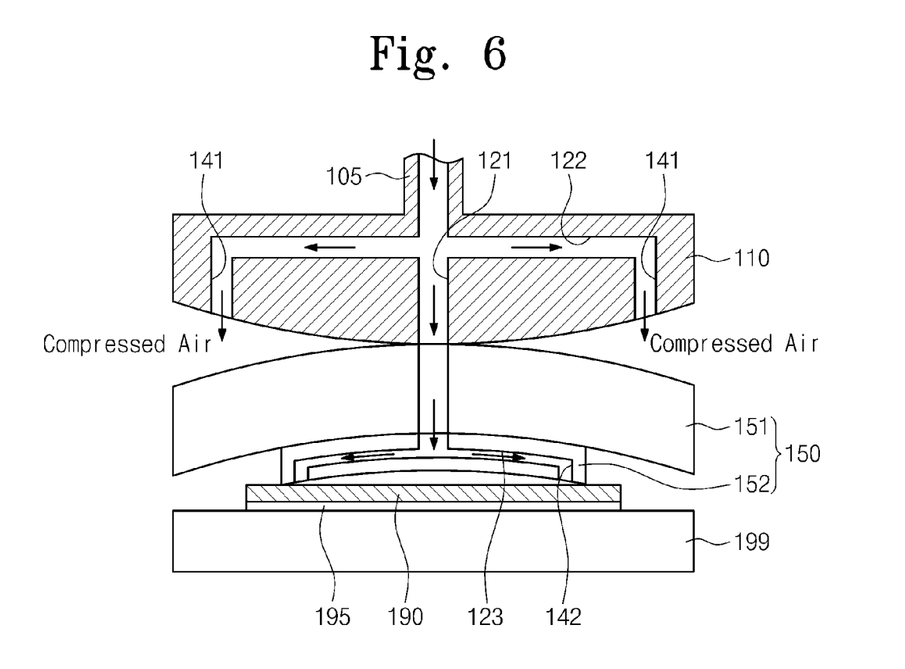

Referring to FIG. 6, the semiconductor chip 190 is detached from the collet body 150. The collet body 150 may be deformed to have a curvature in a direction opposite to that of the collet plate 110. The collet body 150 may be deformed by compressed air. The compressed air may be provided through the same path as that of the vacuum shown in FIGS. 4 and 5. The compressed air is provided to the lower portion of the collet plate 110 through the first pipe 121, the second pipe 122, the first pick-up hole 141, and the first pick-up trench, for example, first pick-up trench 130 shown in FIG. 2. Thus, the pad support 151 may be deformed to have a curvature in the direction opposite to that of the collet plate 110. Also, the pick-up pad 152 contacting the pad support 151 may be deformed to have a curvature in the direction opposite to that of the collet plate 110.

Figure 7:
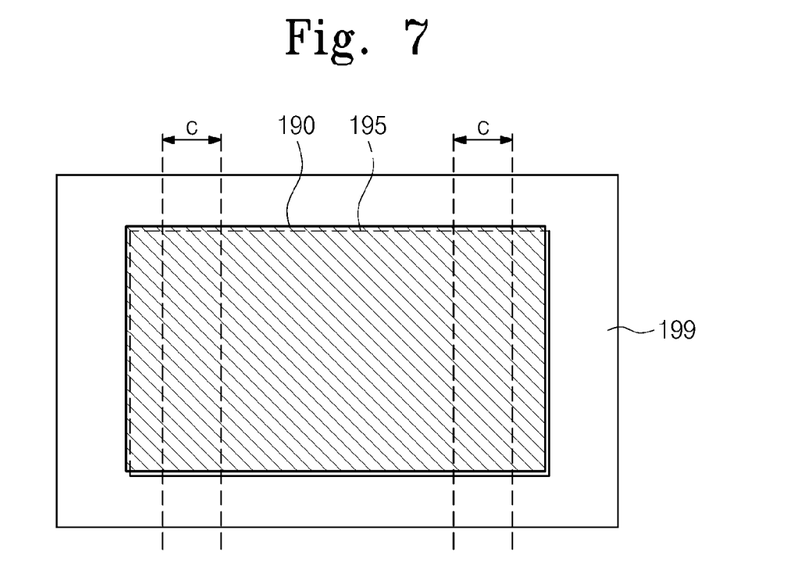

Referring to FIGS. 6 and 7, in a state where the pick-up pad 152 is deformed to have the curvature in the direction opposite to that of the collet plate 110, the pick-up pad 152 may additionally compress the semiconductor chip 190 attached to the substrate 199. A region c of FIG. 7 shows a region in which the pick-up pad 152 applies pressure to the semiconductor chip 190. In an embodiment, the pick-up pad 152 compresses the semiconductor chip 190 against the substrate 199 at region c. The semiconductor chip 190 may be additionally compressed in the region c to prevent the semiconductor chip 190 from being spaced apart from the adhesion layer 195 disposed on the substrate 199, and so that the semiconductor chip 190 uniformly adheres to the substrate 199 across the bottom surface of the semiconductor chip 190.

Figure 8:
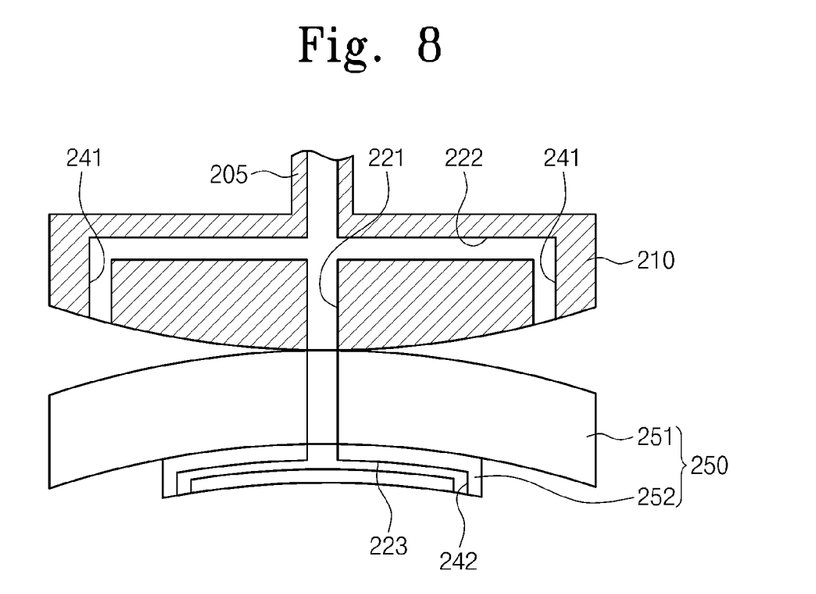
FIGS. 8 through 10 are sectional and plan views illustrating a semiconductor chip attaching apparatus according to another embodiment of the inventive concept.
Figure 9:
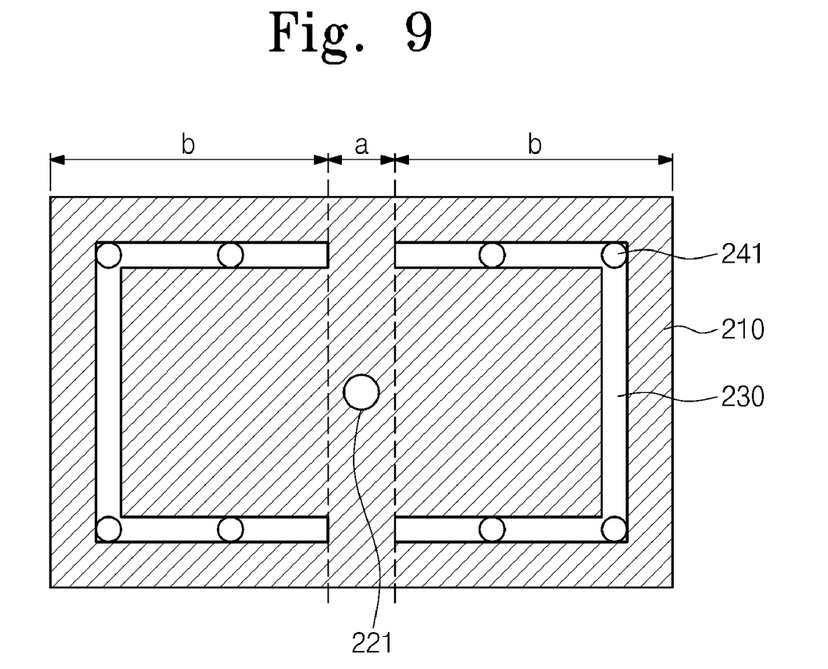
Figure 10:
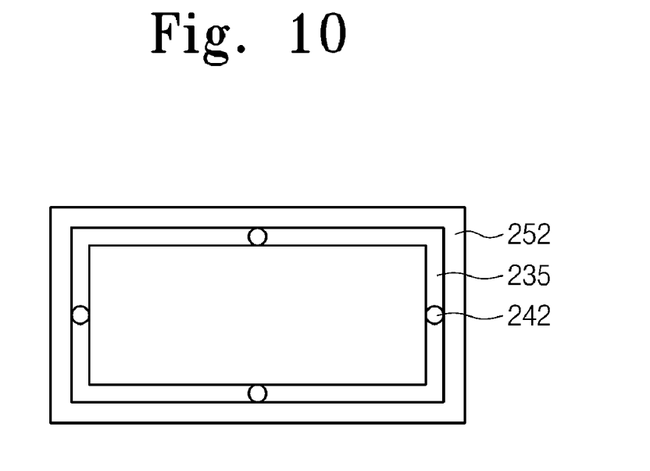

FIGS. 8 to 10 are sectional and plan views for explaining a semiconductor chip attaching apparatus according to another embodiment of the inventive concept. This embodiment is similar to the previously described embodiment except for differences in configurations of a collet body, a pipe, and a trench. Thus, duplicated descriptions will be omitted herein for brevity.

Referring to FIGS. 8 to 10, a collet plate 210 may be disposed on a collet body 250. When a vacuum or compressed air is not provided, an upper surface of the collet body 250 may have a curvature in direction opposite to that of the collet plate 210. The collet plate 210 may be formed of carbon steel. The collet plate 210 may be connected to a shaft 205. A first pipe 221 extends from the shaft 205 to pass through the collet plate 210 and the collet body 250. The first pipe 221 may be configured to apply a vacuum to a semiconductor chip attaching apparatus.

FIG. 9 is a plan view illustrating a lower surface of the collet plate 210. The collet plate 210 may include a central portion a and an edge portion b. The central portion a may be a portion at which the collet plate 210 is attached to the collet body 250. The central portion a may be attached to an upper surface of the collet body 250 using an adhesive. The edge portion b may be spaced apart from the collet body 250. As shown in the sectional view of FIG. 8, the lower surface of the collet plate 210 may have a curvature in a direction opposite to that of the collet body 250, and thus, the collet plate 210 may be spaced apart from the collet body 250.

The collet plate 210 may include a second pipe 222 to deform the collet body 250 so that the collet body 250 can have a curvature in a direction of the collet plate 210. In an embodiment, a vacuum may be applied to the second pipe 222 and one or more pick-up holes extending from the second pipe 222, to deform the collet body 250 such that the collet body 250 has the curvature in the direction of the collet plate 210. The second pipe 222 may be positioned in the collet plate 210. The second pipe 222 may have a diameter less than that of the first pipe 221. The second pipe 222 may extend to a lower surface of the collet plate 210 through a pick-up hole 241. The second pipe 222 may be connected to the first pipe 221. Thus, when the vacuum is applied to the first pipe 121, the vacuum may also be applied to the second pipe 222 and the first pick-up hole 241.

A first pick-up trench 230 connected to the first pick-up hole 241 may be provided in the lower surface of the collet plate 210. The vacuum or compressed air applied to the second pipe 222 may be supplied to the entire lower surface of the collet plate 210 through first pick-up trench 230. A configuration of the first pick-up trench 230 is not limited to that of FIG. 9. For example, the first pick-up trench 230 may have a round shape, an oval shape, a straight line shape, or other shape known to those of ordinary skill in the art.

FIG. 10 is a plan view illustrating a lower portion of the collet body 250. The collet body 250 may include a pick-up pad 252 and a pad support 251. The pick-up pad 252 may pick up a semiconductor chip using a vacuum. The pick-up pad 252 may have a size less than that of the semiconductor chip to easily attach the semiconductor chip. The pick-up pad 252 may include a third pipe 223 to attach the semiconductor chip. A vacuum may be applied to the third pipe 223 to pick up the semiconductor chip. The third pipe 223 may be connected to the first pipe 221. The third pipe 223 may be different in diameter from the first and second pipes 221, 222 to provide a pressure required for picking up the semiconductor chip. For example, the third pipe 223 may have a diameter less than those of the first and second pipes 221 and 222. The third pipe 223 may extend to a lower portion of the pick-up pad 252 through a second pick-up hole 242. A second pick-up trench 235 connected to the second pick-up hole 242 may be provided in a lower surface of the pick-up pad 252. The vacuum or compressed air applied to the third pipe 223 may be supplied to the entire lower surface of the pick-up pad 252 through the second pick-up trench 235. A configuration of the second pick-up trench 235 is not limited to that of FIG. 9. For example, the second pick-up trench 235 may have a round shape, an oval shape, a straight line shape, or other shape known to those of ordinary skill in the art.

The pad support 251 may be disposed between the collet plate 210 and the pick-up pad 252. The pick-up pad 252 and/or the pad support 251 may be formed of materials having elasticity or related properties. For example, the pick-up pad 252 and the pad support 251 may be formed of rubber. The pad support 251 may be deformed by the second pipe 222 to have a curvature, for example, when a vacuum or compressed air is provided to the second pipe 222. The pad support 251 may support the pick-up pad 252 and transfers the deformation to the pick-up pad 252. Thus, the pick-up pad 252 may be deformed to have a same or similar curvature as that of the pad support 251. The pad support 251 may have an upper surface with a curvature in a direction opposite to that of the collet plate 210 in a state where neither a vacuum nor compressed air is applied. Thus, an edge portion of the pad support 251 may be spaced apart from the collet plate 210 in the state where a vacuum or compressed air is not applied.

Figure 11:
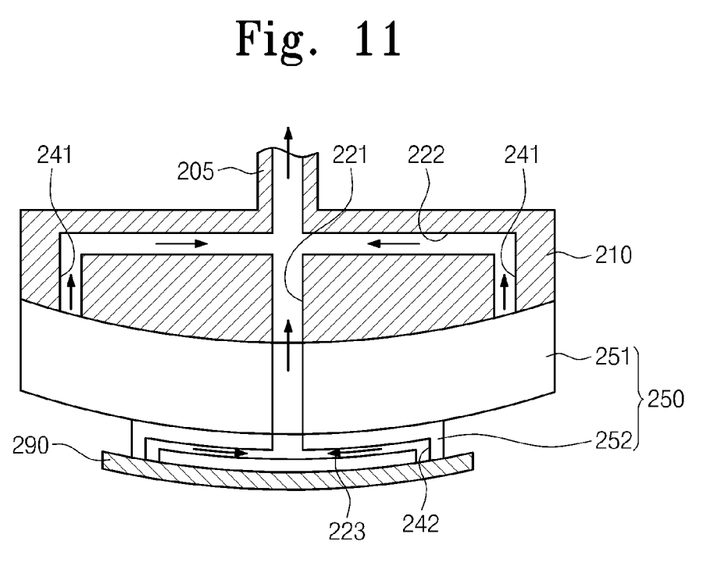
FIGS. 11 through 13 are sectional views illustrating a semiconductor chip attaching method according to another embodiment of the inventive concept.
Figure 12:
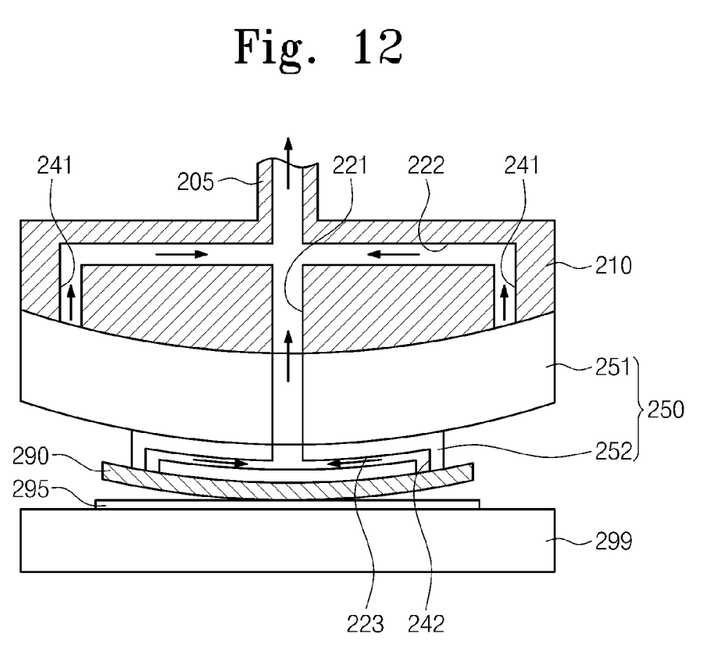
Figure 13:
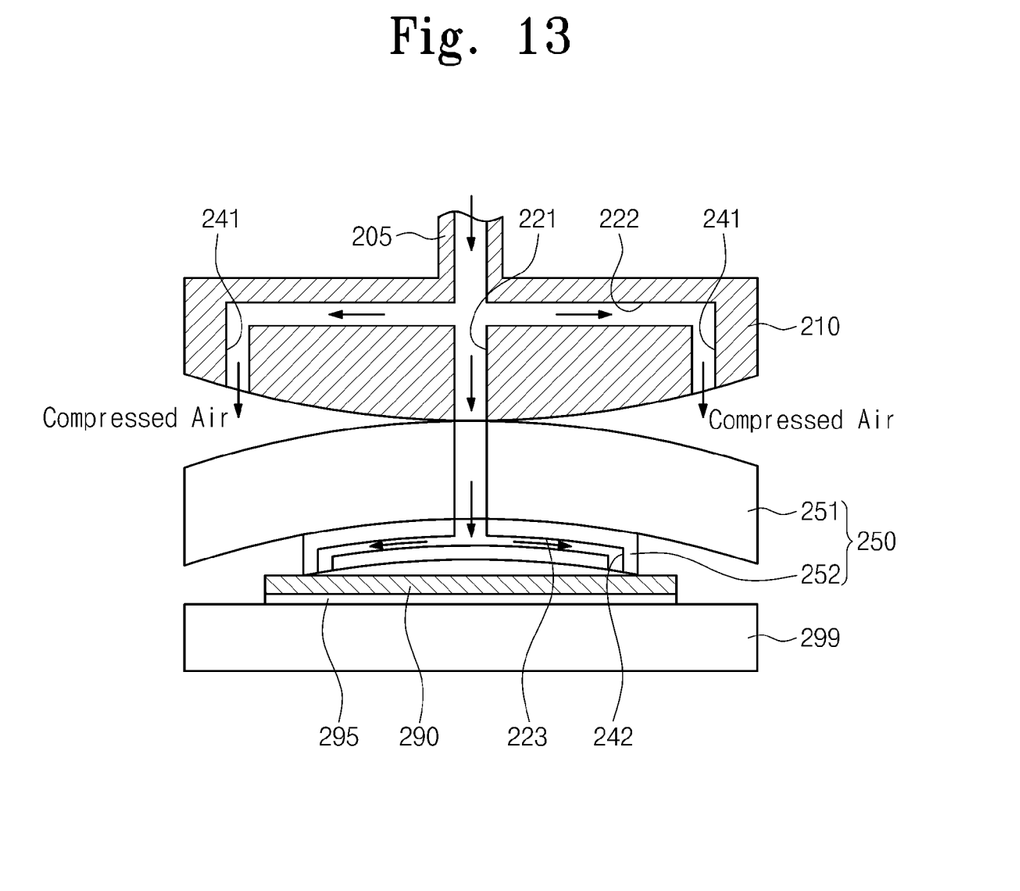

FIGS. 11 to 13 are sectional views illustrating a semiconductor chip attaching method according to another embodiment of the inventive concept.

Referring to FIG. 11, a semiconductor chip 290 is attached to the pick-up pad 252. A vacuum may be applied to attach a semiconductor chip 290 to a pick-up pad 252. The vacuum may be provided through a first pipe 221, a third pipe 223, a second pick-up hole 242, and a second pick-up trench 235 to attach the semiconductor chip 290 to the pick-up pad 252.

A vacuum may be applied to allow the collet body 250 to have a curvature in a direction of the collet plate 210. The vacuum may be provided to the space between the pad support 251 and the collet plate 210 through the first pipe 221, the second pipe 222, the first pick-up hole 241, and the first pick-up trench, for example, trench 230 shown in FIG. 10. The pad support 251 is deformed by the vacuum to have a curvature in the direction of the collet plate 210. The edge portion of the pad support 251 may contact the collet plate 210 due to the vacuum. Also, the pick-up pad 252 may be deformed by the deformation of the pad support 251 to have a curvature in the direction of the collet plate 210. The pick-up pad 252 may easily pick up the semiconductor chip 290 by having a curvature in the direction of the collet plate 210 in cases where the semiconductor chip 290 has a curvature.

Referring to FIG. 12, the semiconductor chip 290 may be disposed on a substrate 299 in case where the semiconductor chip 290 is picked up by the pick-up pad 252. An adhesion layer 295 may be disposed between the substrate 299 and the semiconductor chip 290. The adhesion layer 295 may be an adhesive or an adhesion film. The semiconductor chip 290 may adhere to the substrate 290 by the adhesion layer 295. The substrate 299 may include a PCB or a lead frame. When the semiconductor chip 290 has the curvature in the direction of the collet body 250, the edge portion of the semiconductor chip 290 may be spaced apart from the adhesion layer 295.

Referring to FIG. 13, the semiconductor chip 290 is detached from the collet body 250. The collet body 250 may be recovered to have a curvature in a direction opposite to that of the collet plate 210. The vacuum applied to the collet body 250 may be removed to recover the collet body 250 such that the collet body 250 has the curvature in the direction opposite to that of the collet plate 210, i.e., has an initial configuration. Thus, unlike the previously described embodiment, the compressed air may not be applied. The pick-up pad 252 may additionally compress the edge portion of the semiconductor chip 290 attached to the substrate 299 in a state where the pick-up pad 252 is recovered to have the curvature in the direction opposite to that of the collet plate 210. The edge portion of the semiconductor chip 290 may be additionally compressed to prevent the semiconductor chip 290 from being spaced apart from the adhesion layer 295 disposed on the substrate 199.

According to the above-described embodiments, the collet plate can be deformed using the collet plate having the curvature and the pipe disposed therein to attach the edge portion of the semiconductor chip to the substrate without forming voids.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A semiconductor chip attaching apparatus comprising:
a collet body comprising a pick-up pad and a pad support;
a collet plate on the collet body, the collet plate having a central portion, wherein a lower surface of the central portion contacts an upper surface of the pad support, the collet plate further having an edge portion, wherein a lower surface of the edge portion is spaced apart from the upper surface of the pad support; and
a first pipe extending through the collet plate and the collet body, wherein the collet plate comprises a second pipe in the edge portion.

2. The semiconductor chip attaching apparatus of claim 1, wherein a lower surface of the collet plate has a curvature in a direction opposite to that of the collet body.

3. The semiconductor chip attaching apparatus of claim 2, wherein the upper surface of the pad support is flat.

4. The semiconductor chip attaching apparatus of claim 1, wherein the upper surface of the pad support has a curvature in a direction opposite to that of the collet plate.

5. The semiconductor chip attaching apparatus of claim 1, wherein the pick-up pad comprises a third pipe to which a semiconductor chip is attached.

6. The semiconductor chip attaching apparatus of claim 5, wherein the second pipe and the third pipe are connected to the first pipe.

7. The semiconductor chip attaching apparatus of claim 5, wherein a lower surface of the pick-up pad further comprises a first pick-up trench connected to the third pipe.

8. The semiconductor chip attaching apparatus of claim 5, wherein the third pipe has a diameter less than that of the second pipe.

9. The semiconductor chip attaching apparatus of claim 5, wherein the second pipe has a diameter less than that of the first pipe.

10. The semiconductor chip attaching apparatus of claim 1, wherein the collet body is formed of a material having elasticity.

11. The semiconductor chip attaching apparatus of claim 1, wherein the lower surface of the collet plate further comprises a second pick-up trench connected to the second pipe.

12. The semiconductor chip attaching apparatus of claim 1, wherein the second pipe comprises a plurality of pick-up holes.

* * * * *